United States Patent [19]

Utaka et al.

[11] Patent Number: 4,516,243
[45] Date of Patent: May 7, 1985

[54] DISTRIBUTED FEEDBACK SEMICONDUCTOR LASER

[75] Inventors: Katsuyuki Utaka, Musashino; Kazuo Sakai; Shigeyuki Akiba, both of Tokyo, all of Japan

[73] Assignee: Kokusai Denshin Denwa Kabushiki Kaisha, Tokyo, Japan

[21] Appl. No.: 436,928

[22] Filed: Oct. 27, 1982

[30] Foreign Application Priority Data

Oct. 29, 1981 [JP] Japan .................................. 56-172061

[51] Int. Cl.$^3$ .............................................. H01S 3/098
[52] U.S. Cl. ........................................ 372/96; 372/19; 372/45
[58] Field of Search ....................... 372/96, 44, 45, 46, 372/19; 357/17

[56] References Cited

U.S. PATENT DOCUMENTS 4,257,011  3/1981  Nakamura et al. .................. 372/96

Primary Examiner—James W. Davie
Attorney, Agent, or Firm—Robert E. Burns; Emmanuel J. Lobato; Bruce L. Adams

[57] ABSTRACT

A distributed feedback semiconductor laser which has, in an active layer or an adjoining layer, first corrugations causing periodic refractive index variations in the travelling direction of light and performs laser oscillation by the injection of a current into said active layer portion. In accordance with the present invention, second corrugations are formed to be aligned obliquely to said first corrugations, thereby causing additional loss to the TM mode to permit oscillation in the TE mode alone.

5 Claims, 6 Drawing Figures

DISTRIBUTED FEEDBACK SEMICONDUCTOR LASER

BACKGROUND OF THE INVENTION

The present invention relates to a distributed feedback semiconductor laser.

The distributed feedback semiconductor laser (hereinafter simply referred to as the "DFB laser") has, in an active layer or an adjoining layer, corrugations causing periodic refractive index variations and stably operates at a single wavelength dependent on the period of the corrugations, and hence it has excellent characteristics as a light source for high quality optical fiber communications. Furthermore, since its oscillation wavelength can be arbitrarily controlled by changing the period of the corrugations during fabrication, and since no cleavage plane is needed for a resonator unlike in conventional semiconductor lasers, it is also applicable to an integrated-optics device.

Since the prior art DFB laser has no mechanism for suppressing the TM mode in the resonator, however, it inevitably oscillates in both the TE and TM modes. Ordinarily the TM mode slightly differs in oscillation wavelength from the TE mode and its plane of polarization also differs from that of the latter, so that, in the case of transmission through a single mode fiber, it lowers the transmission capacity due to various dispersions.

On the other hand, an ordinary semiconductor laser utilizing a cleavage plane oscillates only in the TE mode because the reflectivity on the end face slightly differs in the TE and the TM mode, that is, the reflectivity in the TE mode is larger than in the TM mode. As is well-known, however, it is not subject to the axial mode control, and hence oscillates at many wavelengths.

Moreover, in a distributed Bragg-reflector laser (DBR), a metal film is formed on a distributed Bragg reflector to cause an additional loss to the TM mode, thereby permitting oscillation in the TE mode alone.

In the semiconductor lasers, the unification of the mode of oscillation including the control of polarization plane, is also an important condition for the implementation of high quality optical fiber communications.

BRIEF SUMMARY OF THE INVENTION

It is therefore an object of the present invention to provide a distributed feedback semiconductor laser which is single in the plane of polarization as well as in the axial mode of oscillation and which is able to oscillate only in the TE mode by forming oblique and periodic corrugations in an axial mode-controlled, distributed feedback semiconductor laser to cause an additional loss to the TM mode.

In accordance with the present invention, there is provided a distributed feedback semiconductor laser which has, in an active layer or an adjoining layer, first corrugations causing periodic refractive index variations in the travelling direction of light and performs laser oscillation by the injection of a current into said active layer portion, characterized in that second corrugations are formed to be aligned obliquely to said first corrugations, thereby causing additional loss to the TM mode per permit oscillation in the TE mode alone.

BRIEF DESCRIPTION OF THE DRAWINGS

The invention will be described in detail below with reference to the accompanying drawings, in which.

DETAILED DESCRIPTION

Figure 1A:
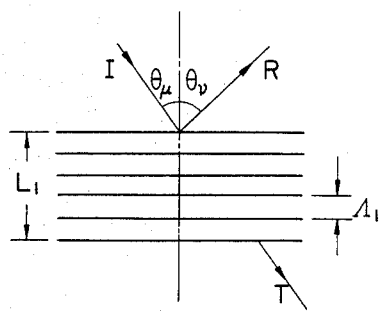
FIGS. 1A and 1B are a schematic diagram showing the relationships of a light wave incident on corrugations obliquely thereto and its diffracted and transmitted waves and a graph showing the incident angle dependency of the coupling coefficient of each polarized wave between the incident wave and the diffracted wave.
Figure 1B:
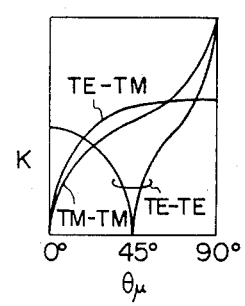

The behavior of a light wave incident on the oblique and periodic corrugations, which are related to the principle of the present invention, is set forth in "Institute of Electrical and Electronic Engineers, Inc. of the United States, Journal of Quantum Electronics, Vol. QE-15, No. 7, pp. 632-637, 1979". Its gist is given below. FIG. 1A shows the relationships of a light wave I incident on corrugations having a period $\Lambda_1$ at an angle of incidence $\theta_\mu$, its diffracted wave R and its transmitted wave T. FIG. 1B shows the incident angle $\theta_\mu$ dependency of the coupling coefficient K of each polarized wave between the incident wave I and the diffracted wave R in the case of a glass waveguide using the illustrated structure. From FIG. 1B, it is seen that when the incident angle $\theta_\mu=45°$, a condition where $K_{TE-TE}=0$, $K_{TM-TM}\neq 0$ and $K_{TE-TM}\neq 0$ is obtained as the coupling coefficient. The period $\Lambda_1$ of the corrugations is given by $$\Lambda_1 = x/(\beta_\mu \cos\theta_\mu + \beta_\nu \cos\theta_\nu) \tag{1}$$

where $\beta_\mu$ is the propagation constant of the incident wave I and $\beta_\nu$ is the propagation constant of the diffracted wave R.

Figure 2A:
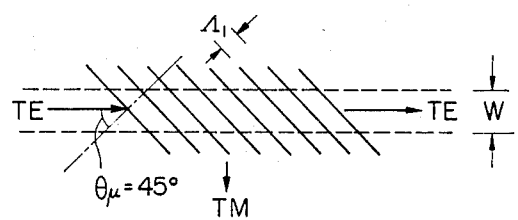
FIGS. 2A and 2B are schematic diagrams showing the behavior of each polarized wave in the case where the corrugations are aligned in the direction inclined at 45° to the lengthwise direction of a stripe region.
Figure 2B:
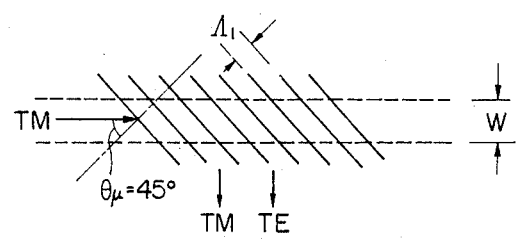

The present invention is to apply the abovesaid principle to the distributed feedback semiconductor laser, and its schematic diagram is shown in FIGS. 2A and 2B. In FIGS. 2A and 2B, the broken lines indicate a stripe region having a width W and the corrugations having the period $\theta_1$ are inclined at 45° to the lengthwise direction of the stripe region. FIG. 2A shows the case where light waves in the TE mode are incident, and since $K_{TE-TM}\neq 0$, a part of the incident waves is converted into the TM mode and diffracted out of the stripe region, resulting in a loss. However, the rest of the incident waves in the TE mode passes through the stripe region without suffering a great loss since $K_{TE-TE}=0$. On the other hand, in the case of incident waves in the TM mode, they are diffracted out of the stripe region in the form of the TE or TM mode as shown in FIG. 2B because of $K_{TE-TM}\neq 0$ and $K_{TM-TM}\neq 0$, resulting in more loss corresponding to $K_{TM\text{-}TM}\neq 0$ than in the case of the TE mode.

Figure 3:
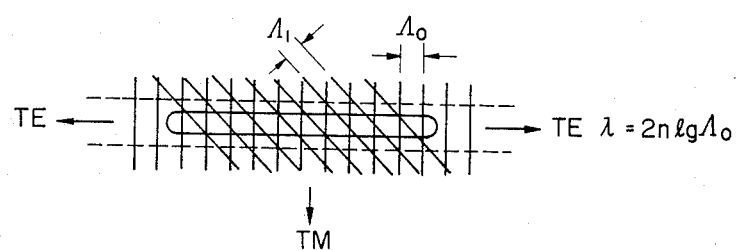
FIG. 3 is a schematic diagram showing the behavior for oscillation in the TE mode when the DFB laser has corrugations which are aligned in the direction inclined at 45° to the lengthwise direction of the stripe region.

FIG. 3 schematically illustrates the structure of the DFB laser which has corrugations of the period $\Lambda_0$ aligned perpendicular to the lengthwise direction of the stripe region and in which corrugations of the period $\Lambda_1$ different from the above-said corrugations are formed to be inclined at an angle of 45° thereto in which the present invention is characterized. Since the incident waves in the TM mode in the stripe region suffer an additional loss by the oblique corrugations as described above, the oscillation threshold value rises and the light waves in the TE mode alone are selectively reflected and amplified to oscillate.

Figure 4:
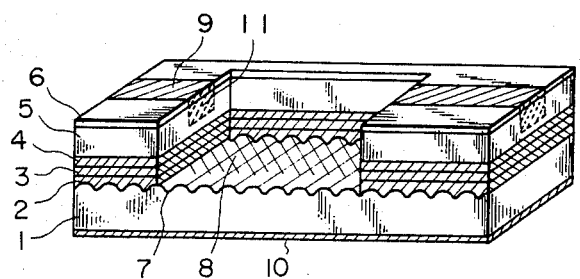
FIG. 4 is a perspective view illustrating an embodiment of the present invention employing the GaInAsP crystal, with a portion of the wafer cut away down to the substrate surface.

FIG. 4 illustrates an embodiment of the present invention which employs a GaInAsP crystal. In FIG. 4, the wafer is shown to be partly cut away for the purpose of clearly showing the corrugations formed on the substrate. In FIG. 4 reference numeral 1 indicates an n type InP substrate; 2 designates waveguide layer formed of n type $Ga_uIn_{1-u}As_vP_{1-v}$; 3 identifies an active layer formed of undoped $Ga_xIn_{1-x}As_yP_{1-y}$; 4 denotes a buffer layer formed of p type $Ga_pIn_{1-p}As_qP_{1-q}$; 5 responsents a p type InP layer; and 6 shows a cap layer formed of p type GaInAsP. These semiconductor layers bear such relationships as $x>u$, p; $y>v$, q, and they can be formed by the liquid phase epitaxial method, the vapor phase epitaxial method, the molecular beam epitaxial method or the like. Reference numeral 7 refers to corrugations of a period $\Lambda_0$ formed on the substrate to provide the function of the DFB laser; 8 signifies corrugations of a period $\Lambda_1$ aligned in the direction inclined at 45° to the lengthwise direction of the stripe direction which causes an additional loss to the TM mode according to the present invention; 9 and 10 indicate electrodes; and 11 designates a Zn diffused region.

While in FIG. 4 the first corrugations of the period $\Lambda_0$ and the second corrugations of the period $\Lambda_1$ are both formed on the substrate, it is possible to obtain the same effects as mentioned above even if the first and second corrugations are formed in any portions in which the electric field of light confined in the waveguide is distributed.

For instance, the corrugations of the period $\Lambda_1$ and the corrugations of the period $\Lambda_0$ need not always be provided in the same layer; namely, the same effects as mentioned above can be obtained even by separately providing the corrugations of the period $\Lambda_1$ and the corrugations of the period $\Lambda_0$ in the portion in which the electric field of the light is distributed.

Moreover, the angle at which the corrugations of the periods $\Lambda_1$ and $\Lambda_0$ cross each other is not limited specially to 45° but may also be within an angular range in which the coupling coefficient between the TM-TM mode is sufficiently larger than that between the TE-TE mode.

Furthermore, in a waveguide structure in which the propagation constant $\beta_\mu$ of the incident wave and the propagation constant $\beta_v$ of the diffracted wave generally assume different values in Eq. (1), for example, in a buried structure, the incident angle $\theta_\mu$ at which the coupling coefficient between the TE-TE mode goes to zero assumes a value different from 45°.

Besides, although an electrode stripe structure is shown as an embodiment of the present invention for the sake of brevity, the invention is applicable to any structures with which the DFB laser can be fabricated, including a buried structure which is subject to lateral mode control.

The present invention has been described as being applied to a mixed crystal structure using the GaInAsP system, but the invention can be carried into practice through utilization a mixed crystal of the AlGaAs system, InGaAlAs system, InGaSb system and so on.

As has been described in the foregoing, according to the present invention, a semiconductor laser which operates in a single mode, including the control of polarization plane, can be realized and can be expected as a light source for high quality optical fiber communications.

What we claim is:

1. A distributed feedback semiconductor laser comprising, a semiconductor substrate, a plurality of semiconductor layers, first and second corrugations on said substrate for causing periodic refractive index variations in the travelling direction of light propagation in the laser for effectively causing loss of TM mode of oscillation and permitting oscillation in the TE mode alone, and electrodes on said substrate and on one of said semiconductor layers for injection of current into the laser.

2. A distributed feedback semiconductor laser which has, an active layer having first corrugations causing periodic refractive index variations in the traveling direction of light and performs laser oscillations by the injection of a current into said active layer portion, and electrodes on the semiconductor for injection of said current, characterized in that semiconductor means are provided having second corrugations formed aligned obliquely to said first corrugations, effectively causing additional loss to the TM mode of oscillation and to permit oscillation in the TE mode alone.

3. A distributed feedback semiconductor laser having means defining a semiconductor effective as a waveguide layer for propagation of light radiation, electrodes for applying power to the semiconductor laser, semiconductor means in said laser defining first corrugations for causing periodic refractive index variations in the travelling direction of light propagation and for performing laser oscillation by injection of a current therein, and semiconductor means for defining second corrugations disposed relative to the first corrugations for effectively causing loss of the TM mode of oscillation of the semiconductor laser and permitting oscillation in the TE mode alone.

4. A distributed feedback semiconductor laser according to claim 3, in which said semiconductor means defining said first corrugations and said means defining said second corrugations are each adjacent portions of a common semiconductor layer.

5. A distributed feedback semiconductor laser according to claim 3, in which said semiconductor means defining said first corrugations and said semiconductor means defining said second corrugations are separate semiconductor layers.

* * * * *